US012672400B2

(12) United States Patent
Basrur et al.

(10) Patent No.: US 12,672,400 B2
(45) Date of Patent: Jun. 30, 2026

(54) DISPLAY DEVICE

(71) Applicant: Samsung Display Co., LTD., Yongin-si (KR)

(72) Inventors: Veidhes Basrur, Yongin-si (KR); Ki Nyeng Kang, Sejong-si (KR); Ock Soo Son, Seoul (KR); Jong Hwan Cha, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 819 days.

(21) Appl. No.: 17/969,030

(22) Filed: Oct. 19, 2022

(65) Prior Publication Data

US 2023/0275191 A1 Aug. 31, 2023

(30) Foreign Application Priority Data

Feb. 28, 2022 (KR) ........................ 10-2022-0026131

(51) Int. Cl.
H10H 20/831 (2025.01)
H10H 20/851 (2025.01)
(Continued)

(52) U.S. Cl.
CPC .... H10H 20/8316 (2025.01); H10H 20/8514 (2025.01); H10H 20/857 (2025.01); H10W 90/00 (2026.01)

(58) Field of Classification Search
CPC .... H10H 20/831; H10H 20/84; H10H 20/855; H10H 20/851; H10H 20/8316;
(Continued)

(56) References Cited

U.S. PATENT DOCUMENTS 8,766,292 B2 7/2014 Kim et al.
RE47,544 E 7/2019 Kim et al.
(Continued)

FOREIGN PATENT DOCUMENTS

KR 10-1228885 B1 1/2013
KR 10-1436123 11/2014
(Continued)

OTHER PUBLICATIONS

KR200038389 (Year: 2020) English translation.*

*Primary Examiner* — Latanya N Crawford Eason
(74) *Attorney, Agent, or Firm* — Womble Bond Dickinson (US) LLP

(57) ABSTRACT

A display device includes a substrate including a first light emitting area, a second light emitting area, and a third light emitting area; first banks spaced apart from each other on the substrate; first electrodes and second electrodes disposed on the first bank, covering the first bank, and spaced apart from each other; light emitting elements respectively disposed on the first electrodes and the second electrodes; and second banks respectively disposed on the first electrodes and the second electrodes, the second banks include a second-first bank defining the first light emitting area, a second-second bank defining the second light emitting area, and a second-third bank defining the third light emitting area, and a size of the second-first bank, a size of the second-second bank, and a size of the second-third bank are different from each other in a plan view.

19 Claims, 11 Drawing Sheets

BNK2: BNK21, BNK22, BNK23

(51) Int. Cl.
    *H10H 20/857*     (2025.01)
    *H10W 90/00*     (2026.01)

(58) Field of Classification Search
    CPC ............. H10H 20/8514; H10H 20/857; H10H
               29/8514; H10H 29/49; H10H 29/857;
               H10H 29/922; H10H 29/942; H01L
               25/0753; H01L 25/167; H10K 59/122;
               H10K 59/123; H10W 90/10; H10W
               90/00; H10W 90/15; H10W 90/155;
               H10D 86/40
    See application file for complete search history.

(56)             References Cited

U.S. PATENT DOCUMENTS

| | | | |
|---|---|---|---|
| 11,903,270 B2 | 2/2024 | Kim et al. | |
| 2014/0292622 A1 | 10/2014 | Lee | |
| 2017/0062536 A1 | 3/2017 | Madigan et al. | |
| 2018/0033842 A1* | 2/2018 | Bae ..................... | H10K 59/352 |
| 2020/0013766 A1* | 1/2020 | Kim ..................... | H01L 25/167 |
| 2024/0251616 A1 | 7/2024 | Kim et al. | |

FOREIGN PATENT DOCUMENTS

| | | | | |
|---|---|---|---|---|
| KR | 20200038389 A | * | 4/2020 | ........... H01L 27/156 |
| KR | 10-2021-0113478 A | | 9/2021 | |
| KR | 10-2022-0000447 A | | 1/2022 | |

\* cited by examiner

DR3

EL: AE, ED, CE
SUB: SUB1, SUB2

BNK2: BNK21, BNK22, BNK23

BNK2: BNK21, BNK22, BNK23

BNK2: BNK21, BNK22, BNK23

BNK2: BNK21, BNK22, BNK23

BNK2: BNK21, BNK22, BNK23

DISPLAY DEVICE

CROSS-REFERENCE TO RELATED APPLICATION(S)

This application claims priority to and benefits of Korean Patent Application No. 10-2022-0026131 under 35 U.S.C. § 119 filed on Feb. 28, 2022 in the Korean Intellectual Property Office, the entire contents of which are incorporated herein by reference.

BACKGROUND

1. Technical Field

The disclosure relates to a display device.

2. Description of the Related Art

As the information society develops, the demand for a display device for displaying an image is increasing in various forms. For example, the display device has been applied to various electronic devices such as smartphones, digital cameras, laptop computers, navigation devices, and smart televisions. The display device may be a flat panel display device such as a liquid crystal display device, a field emission display device, or an organic light emitting display device. Among the flat panel display devices, the light emitting display device may include a light emitting element in which each pixel of a display panel may emit light by itself, thereby displaying an image without a backlight unit providing light to the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device of a uniform current density for each sub-pixel.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, a display device may include a substrate including a first light emitting area, a second light emitting area, and a third light emitting area; first banks spaced apart from each other on the substrate; first electrodes and second electrodes disposed on the first bank, covering the first bank, and spaced apart from each other; light emitting elements respectively disposed on the first electrodes and the second electrodes, and second banks respectively disposed on the first electrodes and the second electrodes, wherein the second banks include a second-first bank defining the first light emitting area, a second-second bank defining the second light emitting area, and a second-third bank defining the third light emitting area, and a size of the second-first bank in, a size of the second-second bank, and a size of the second-third bank are different from each other in a plan view.

A width of the second-first bank, a width of the second-second bank, and a width of the second-third bank may be identical.

A length of the second-first bank, a length of the second-second bank, and a length of the second-third bank may be different from each other.

The light emitting elements may include a first light emitting element disposed in the first light emitting area, a second light emitting element disposed in the second light emitting area, and a third light emitting element disposed in the third light emitting area.

The first light emitting element, the second light emitting element, and the third light emitting element may emit light of a same color.

The light of the color emitted by the first light emitting element, the second light emitting element, and the third light emitting element may be blue.

A first electrode of the first electrodes overlapping the first light emitting elements in a plan view may be applied with a first current, a first electrode of the first electrodes overlapping the second light emitting elements in the plan view may be applied with a second current, and a first electrode of the first electrodes overlapping the third light emitting elements in the plan view may be applied with a third current.

Each of a magnitude of the first current and a magnitude of the second current may be greater than a magnitude of the third current.

Each of the length of the second-first bank and the length of the second-second bank may be greater than the length of the second-third bank.

Each of a number of the first light emitting elements in the first light emitting area and a number of the second light emitting elements in the second light emitting area may be greater than a number of the third light emitting elements in the third light emitting area.

The magnitude of the first current may be greater than the magnitude of the second current.

The length of the second-first bank may be greater than the length of the second-second bank.

The display device may further comprise a first contact electrode electrically connected to the first electrodes and electrically contacting an end of each of the light emitting elements, and a second contact electrode electrically connected to the second electrode and electrically contacting another end of each of the light emitting elements.

The display device may further comprise a first element insulating layer disposed between the first electrodes and the second electrodes, and the light emitting elements, and a second element insulating layer disposed on a top surface of the light emitting elements.

The first contact electrode may directly contact a top surface on a side of the second element insulating layer, the second contact electrode may directly contact a top surface on another side of the second element insulating layer, and the first contact electrode and the second contact electrode may expose a top surface of a central portion of the second element insulating layer.

The display device may further comprise a third element insulating layer covering and contacting the first contact electrode and the second contact electrode.

According to an embodiment, a display device may include a substrate including a first light emitting area, a second light emitting area, a third light emitting area, and a light blocking area disposed between an adjacent first light emitting area, second light emitting area and third light emitting area; first banks spaced apart from each other on the substrate; first electrodes and second electrodes disposed on the first bank, covering the first bank, and spaced apart from each other; light emitting elements respectively disposed on the first electrodes and the second electrodes, and second banks respectively disposed on the first electrodes and the second electrodes, in the light blocking area, wherein the second banks may include a second-first bank defining the first light emitting area, a second-second bank defining the second light emitting area, and a second-third bank defining the third light emitting area, and a size of the second-first bank, a size of the second-second bank, and a size of the second-third bank are different from each other in a plan view.

The light emitting elements may include a first light emitting element disposed in the first light emitting area, a second light emitting element disposed in the second light emitting area, and a third light emitting element disposed in the third light emitting area, and a number of the first light emitting elements in the first light emitting area, a number of the second light emitting elements in the second light emitting area, and a number of the third light emitting elements in the third light emitting area may be different from each other.

The display device may further comprise a first wavelength conversion portion disposed on the first light emitting element on the first light emitting area, a second wavelength conversion portion disposed on the second light emitting element on the second light emitting area, and a light transmission portion disposed on the third light emitting element on the third light emitting area.

The display device may further comprise a light blocking member disposed between the first wavelength conversion portion, the second wavelength conversion portion, and the light transmission portion adjacent to each other on the light blocking area.

Details of other embodiments are included in the detailed description and drawings.

According to the display device according to embodiments, an efficiency of the light emitting elements may be improved.

However, the effects of the embodiments are not restricted to those set forth herein. The above and other effects of the embodiments will become more apparent to one of ordinary skill in the art to which the embodiments pertain and by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
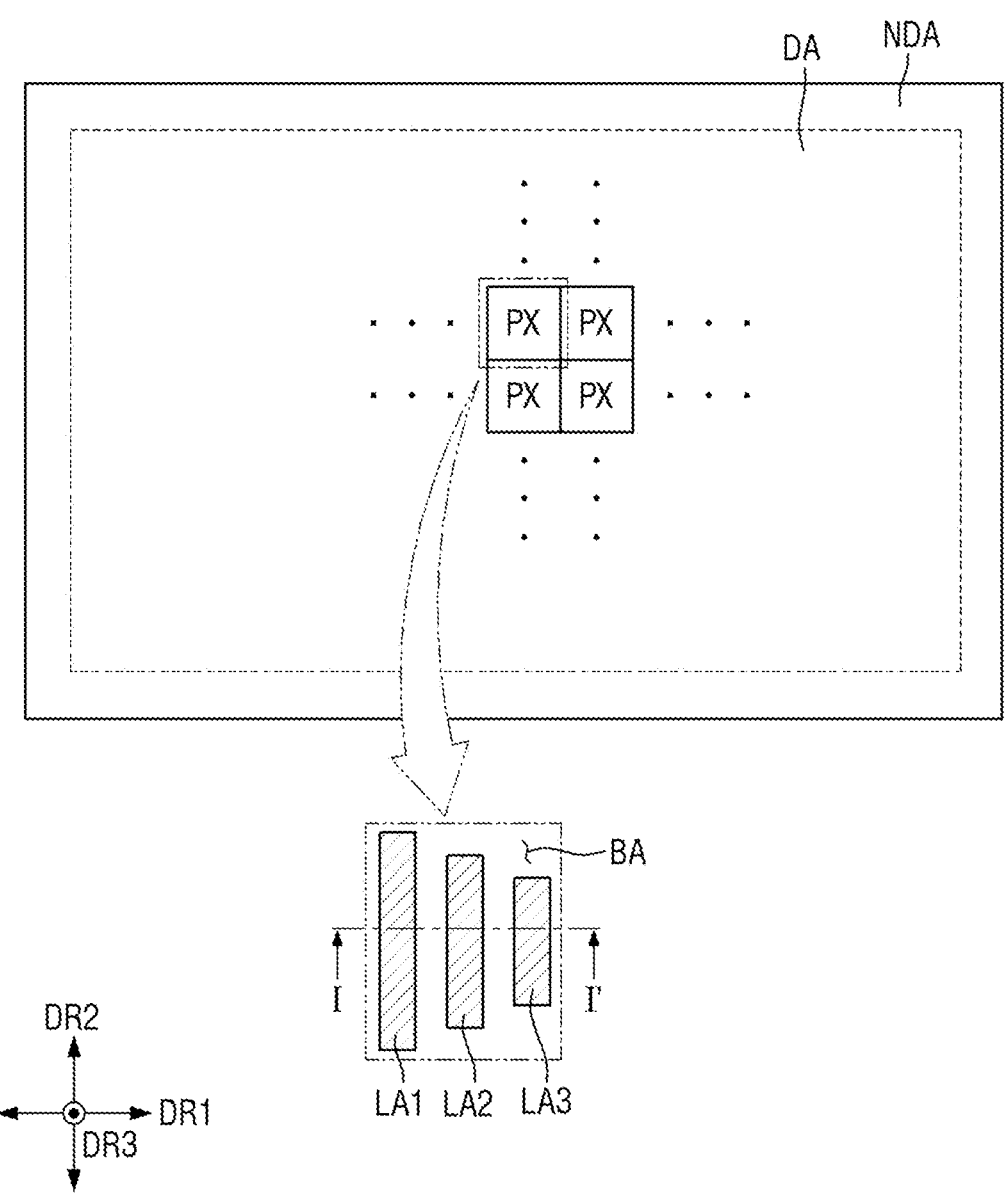
FIG. 1 is a schematic plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

Hereinafter, embodiments will be described with reference to the accompanying drawings.

FIG. 1 is a plan view illustrating a display device according to an embodiment.

Referring to FIG. 1, a display device according to an embodiment may have a rectangular planar shape. However, the planar shape of the display device is not limited thereto and may have a square, circular, oval, or other polygonal shapes. Hereinafter, a case in which the rectangular shape is applied as the planar shape of the display device will be described. It is to be understood that the shapes disclosed herein may also include shapes substantial to the shapes disclosed herein.

The display device may include a display panel providing a display screen. Examples of the display panel may include an inorganic light emitting diode display panel, an organic light emitting display panel, a quantum dot light emitting display panel, a plasma display panel, a field emission display panel, and the like within the spirit and the scope of the disclosure. Hereinafter, a case in which the inorganic light emitting diode display panel is applied as an example of the display panel will be described by way of example, but the disclosure is not limited thereto, and the same technical idea may be applied to other display panels if applicable.

The display device may include a display area DA and a non-display area NDA. The display area DA may include a pixels PX to display an image. The pixels PX may be arranged or disposed in a matrix manner. The non-display area NDA may be disposed around the display area DA to surround the display area DA, and may not display an image. The non-display area NDA may completely surround the display area DA in a plan view. The display area DA may also be referred to as an active area, and the non-display area NDA may also be referred to as a non-active area. The display area DA may occupy substantially the center of the display device. The non-display area NDA may be adjacent to the display area DA The non-display area NDA may be positioned on the other side of the display area DA in a first direction DR1, one side or a side thereof in the first direction DR1, one side or a side thereof in a second direction DR2, and the other side thereof in the second direction DR2, respectively. However, the non-display area NDA is not limited thereto, and may also be positioned only on one side or a side and the other side or another side of the display area DA in the first direction DR1, or may also be positioned on one side or a side and the other side or another side thereof in the second direction DR2. Lines or circuit drivers included in the display device may be disposed in each of the non-display areas NDA, or external devices may be mounted thereon.

Referring to the enlarged view of FIG. 1, each of the pixels of the display device may include light emitting areas LA1, LA2, and LA3 defined by a pixel defining layer, and may emit light having a peak wavelength through the light emitting areas LA1, LA2, and LA3. For example, the display area DA of the display device may include first to third light emitting areas LA1, LA2, and LA3. Each of the first to third light emitting areas LA1, LA2, and LA3 may be an area in which light generated by a light emitting element of the display device is emitted to the outside of the display device.

The first to third light emitting areas LA1, LA2, and LA3 may emit light having a peak wavelength to the outside of the display device. The first light emitting area LA1 may emit light of a first color, the second light emitting area LA2 may emit light of a second color, and the third light emitting area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but the disclosure is not limited thereto.

The display area DA of the display device may include a light blocking area BA between the light emitting areas positioned between the light emitting areas LA1, LA2, and LA3 adjacent to each other. For example, the light blocking area BA between the light emitting areas may surround the first light emitting area LA1 to the third light emitting area LA3. In an embodiment, a size of the first light emitting area LA1 in a plan view, a size of the second light emitting area LA2 in a plan view, and a size of the third light emitting area LA3 in a plan view may be different from each other. For example, the size of the first light emitting area LA1 in a plan view may be greater than the size of the second light emitting area LA2 in a plan view, and the size of the second light emitting area LA2 in a plan view may be greater than the size of the third light emitting area LA3 in a plan view. Each of the light emitting areas LA1, LA2, and LA3 may be defined by a second bank BNK2 (BNK21, BNK22, and BNK23 in FIG. 3) to be described later. The second banks BNK2 (BNK21, BNK22, and BNK23) may overlap the light blocking area BA between the light emitting areas, but is not limited thereto.

Figure 2:
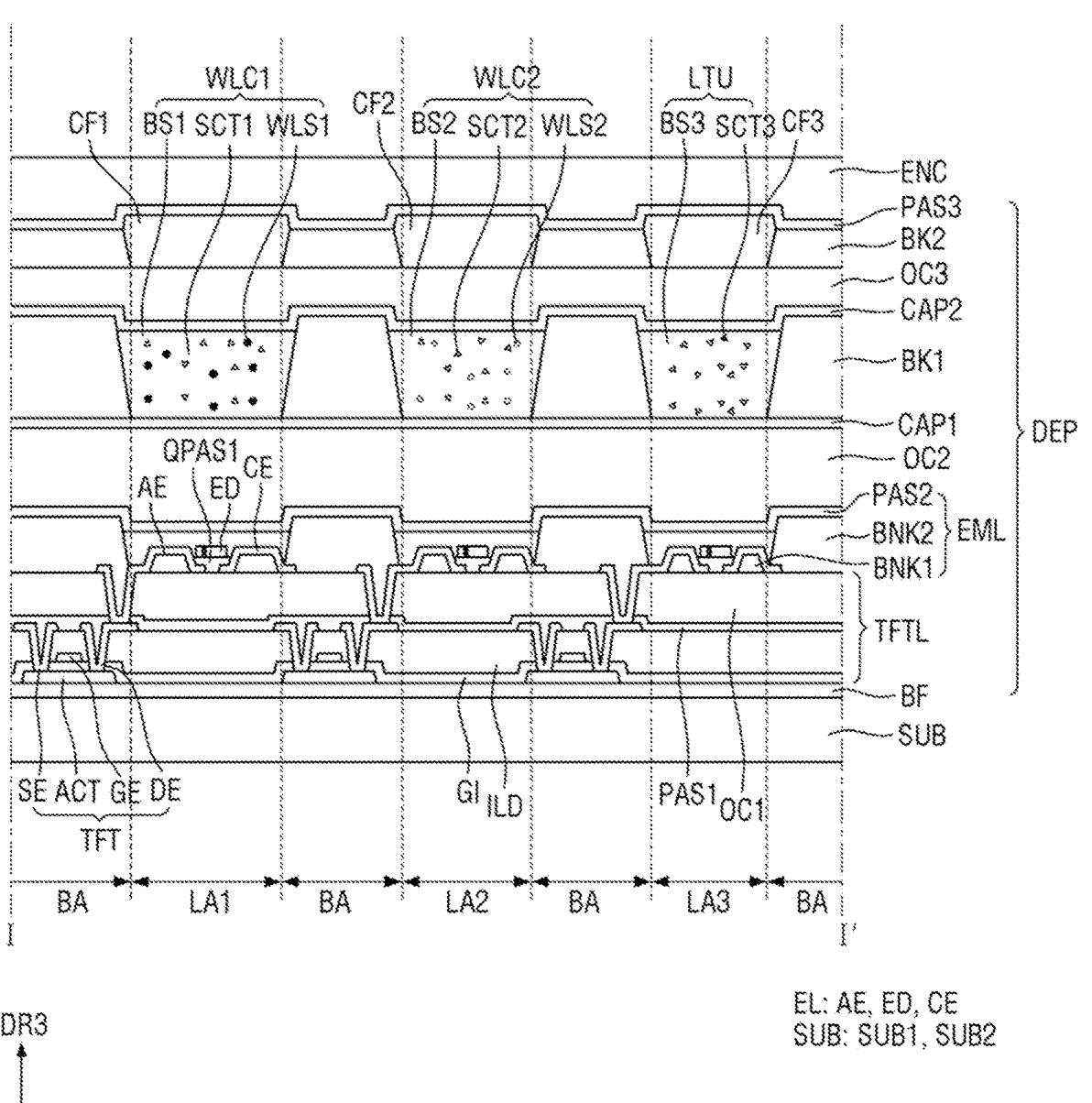
FIG. 2 is a schematic cross-sectional view taken along line I-I' of an enlarged view of FIG. 1.

FIG. 2 is a schematic cross-sectional view taken along line I-I' of an enlarged view of FIG. 1.

Referring to FIG. 2, the display device may include a base substrate SUB disposed across the display area DA and the non-display area NDA, a display element layer DEP on the base substrate SUB disposed in the display area DA, and an encapsulation member ENC disposed across the display area DA and the non-display area NDA and sealing the display element layer DEP.

The base substrate SUB may be made of an insulating material such as a polymer resin. The insulating material may include, for example, polyimide (PI), but is not limited thereto. The base substrate SUB may also include a first base substrate SUB1 and a second base substrate SUB2 of the same material or a similar material.

The display element layer DEP may include a buffer layer BF, a thin film transistor layer TFTL, a light emitting element layer EML, a second planarization layer OC2, a first capping layer CAP1, a first light blocking member BK1, a first wavelength conversion portion WLC1, a second wavelength conversion portion WLC2, a light transmission portion LTU, a second capping layer CAP2, a third planarization layer OC3, a second light blocking member BK2, first to third color filters CF1, CF2, and CF3, a third passivation layer PAS3, and an encapsulation member ENC.

The buffer layer BF may be disposed on the base substrate SUB. The buffer layer BF may be formed of an inorganic film that prevents the permeation of air or moisture.

The thin film transistor layer TFTL may include a thin film transistor TFT, a gate insulating film GI, an interlayer insulating film ILD, a first passivation layer PAS1, and a first planarization layer OC1.

The thin film transistor TFT may be disposed on the buffer layer BF, and may constitute a pixel circuit of each of the pixels.

A semiconductor layer ACT may be provided on the buffer layer BF. The semiconductor layer ACT may overlap a gate electrode GE, a source electrode SE, and a drain electrode DE. The semiconductor layer ACT may be in direct contact with the source electrode SE and the drain electrode DE, and may face the gate electrode GE with the gate insulating film GI interposed therebetween.

The gate electrode GE may be disposed on an upper side of the gate insulating film GI. The gate electrode GE may overlap the semiconductor layer ACT with the gate insulating film GI interposed therebetween.

The source electrode SE and the drain electrode DE may be disposed to be spaced apart from each other on the interlayer insulating film ILD. The source electrode SE may be in contact with one end or an end of the semiconductor layer ACT through a contact hole provided in the gate insulating film GI and the interlayer insulating film ILD. The drain electrode DE may be in contact with the other end of the semiconductor layer ACT through a contact hole provided in the gate insulating film GI and the interlayer insulating film ILD. The drain electrode DE may be connected to a first electrode AE of a light emitting member EL through a contact hole provided in the first passivation layer PAS1 and the first planarization layer OC1.

The gate insulating film GI may be provided on an upper side of the semiconductor layer ACT. For example, the gate insulating film GI may be disposed on the upper side of the semiconductor layer ACT and the buffer layer BF, and may insulate the semiconductor layer ACT and the gate electrode GE. The gate insulating film GI may include a contact hole through which the source electrode SE penetrates and a contact hole through which the drain electrode DE penetrates.

The interlayer insulating film ILD may be disposed on an upper side of the gate electrode GE. For example, the interlayer insulating film ILD may include a contact hole through which the source electrode SE penetrates and a contact hole through which the drain electrode DE penetrates.

The first passivation layer PAS1 may be provided on an upper side of the thin film transistor TFT to protect the thin film transistor TFT. For example, the first passivation layer PAS1 may include a contact hole through which the first electrode AE penetrates.

The first planarization layer OC1 may be provided on an upper side of the first passivation layer PAS1 to planarize an upper end of the thin film transistor TFT. For example, the first planarization layer OC1 may include a contact hole through which the first electrode AE of the light emitting member EL penetrates.

The light emitting element layer EML may include a light emitting member EL, a first bank BNK1, a second bank BNK2, a first element insulating layer QPAS1, and a second passivation layer PAS2.

The light emitting member EL may be provided on the thin film transistor TFT. The light emitting member EL may include a first electrode AE, a second electrode CE, and a light emitting element ED.

The first electrode AE may be provided on an upper side of the first planarization layer OC1. For example, the first electrode AE may be disposed on the first bank BNK1 disposed on the first planarization layer OC1 to cover the first bank BNK1. The first electrode AE may be disposed to overlap one of the first to third light emitting areas LA1, LA2, and LA3 defined by the second bank BNK2. The first electrode AE may be connected to the drain electrode DE of the thin film transistor TFT.

The second electrode CE may be provided on an upper side of the first planarization layer OC1. For example, the second electrode CE may be disposed on the first bank BNK1 disposed on the first planarization layer OC1 to cover the first bank BNK1. The second electrode CE may be disposed to overlap one of the first to third light emitting areas LA1, LA2, and LA3 defined by the second bank BNK2. For example, the second electrode CE may receive a common voltage supplied to all pixels.

The first element insulating layer QPAS1 may cover a portion of the first electrode AE and a portion of the second electrode CE adjacent to each other, and may insulate the first electrode AE and the second electrode CE.

The light emitting element ED may be disposed between the first electrode AE and the second electrode CE on the upper side of the first planarization layer OC1. The light emitting element ED may be disposed on the first element insulating layer QPAS1. One end or an end of the light emitting element ED may be connected to the first electrode AE, and the other end of the light emitting element ED may be connected to the second electrode CE. For example, the light emitting elements ED may include an active layer having the same material or a similar material to emit light of the same wavelength band or light of the same color. Light emitted from each of the first to third light emitting areas LA1, LA2, and LA3 may have the same color. For example, the light emitting elements ED may emit light of a third color or blue light having a peak wavelength in the range of about 440 nm to about 480 nm.

The second bank BNK2 may be disposed on the first planarization layer OC1 to define the first to third light emitting areas LA1, LA2, and LA3. For example, the second bank BNK2 may surround each of the first to third light emitting areas LA1, LA2, and LA3, but is not limited thereto. The second bank BNK2 may be disposed in the light blocking areas BA.

The second passivation layer PAS2 may be disposed on the light emitting members and the second bank BNK2. The second passivation layer PAS2 may cover the light emitting members and may protect the light emitting members.

The display device may further include a second planarization layer OC2, a first capping layer CAP1, a first light blocking member BK1, a first wavelength conversion portion WLC1, a second wavelength conversion portion WLC2, a light transmission portion LTU, a second capping layer CAP2, a third planarization layer OC3, a second light blocking member BK2, first to third color filters CF1, CF2, and CF3, a third passivation layer PAS3, and an encapsulation member ENC.

The second planarization layer OC2 may be provided on an upper side of the light emitting element layer EML to planarize an upper end of the light emitting element layer EML. The second planarization layer OC2 may include an organic material.

The first capping layer CAP1 may be disposed on the second planarization layer OC2. The first capping layer CAP1 may seal bottom surfaces of the first and second wavelength conversion portions WLC1 and WLC2 and the light transmission portion LTU. The first capping layer CAP1 may include an inorganic material.

The first light blocking member BK1 may be disposed in the light blocking areas BA on the first capping layer CAP1. The first light blocking member BK1 may overlap the second bank BNK2 in a thickness direction. The first light blocking member BK1 may block transmission of light.

The first light blocking member BK1 may include an organic light blocking material and a liquid repellent component.

As the first light blocking member BK1 may include the liquid repellent component, the first light blocking member BK1 may separate the first and second wavelength conversion portions WLC1 and WLC2 and the light transmission portion LTU into corresponding light emitting areas LA.

The first wavelength conversion portion WLC1 may be disposed in the first light emitting area LA1 on the first capping layer CAP1. The first wavelength conversion portion WLC1 may be surrounded by the first light blocking member BK1. The first wavelength conversion portion WLC1 may include a first base resin BS1, a first scatterer SCT1, and a first wavelength shifter WLS1.

The first base resin BS1 may include a material having a relatively high light transmittance. The first base resin BS1 may be made of a transparent organic material. For example, the first base resin BS1 may include at least one of organic materials such as an epoxy-based resin, an acrylic resin, a cardo-based resin, and an imide-based resin.

The first scatterer SCT1 may have a refractive index different from that of the first base resin BS1, and may form an optical interface with the first base resin BS1.

The first wavelength shifter WLS1 may convert or shift a peak wavelength of incident light to a first peak wavelength. For example, the first wavelength shifter WLS1 may convert the blue light provided from the display device into red light having a single peak wavelength in the range of about 610 nm to about 650 nm and emit the red light. The first wavelength shifter WLS1 may be a quantum dot, a quantum rod, or a phosphor. The quantum dot may be a particulate matter that emits a specific color as electrons transition from a conduction band to a valence band.

The light emitted by the first wavelength shifter WLS1 may have a light emitting wavelength spectrum full width of half maximum (FWHM) of about 45 nm or less, or about 40 nm or less, or about 30 nm or less, and color purity and color reproducibility of colors displayed by the display device may be further improved.

A portion of the blue light provided from the light emitting element layer EML may be transmitted through the first wavelength conversion portion WLC1 without being converted into the red light by the first wavelength shifter WLS1. Light incident on the first color filter CF1 without being converted by the first wavelength conversion portion WLC1 in the blue light provided from the light emitting element layer EML may be blocked by the first color filter CF1. The red light converted by the first wavelength conversion portion WLC1 in the blue light provided from the display device may be transmitted through the first color filter CF1 and emitted to the outside. Accordingly, the first light emitting area LA1 may emit the red light.

The second wavelength conversion portion WLC2 may be disposed in the second light emitting area LA2 on the first capping layer CAP1. The second wavelength conversion portion WLC2 may be surrounded by the first light blocking member BK1. The second wavelength conversion portion WLC2 may include a second base resin BS2, a second scatterer SCT2, and a second wavelength shifter WLS2.

The second base resin BS2 may include a material having a relatively high light transmittance. The second base resin BS2 may be made of a transparent organic material.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light.

The second wavelength shifter WLS2 may convert or shift the peak wavelength of the incident light to a second peak wavelength different from the first peak wavelength of the first wavelength shifter WLS1. For example, the second wavelength shifter WLS2 may convert the blue light provided from the display device into green light having a single peak wavelength in the range of about 510 nm to about 550 nm and emit the green light. The second wavelength shifter WLS2 may be a quantum dot, a quantum rod, or a phosphor. The second wavelength shifter WLS2 may include the same material or a similar material as the material of the first wavelength shifter WLS1.

The light transmission portion LTU may be disposed in the third light emitting area LA3 on the first capping layer CAP1. The light transmission portion LTU may be surrounded by the first light blocking member BK1. The light transmission portion LTU may transmit incident light there-through while maintaining a peak wavelength of the incident light. The light transmission portion LTU may include a third base resin BS3 and a third scatterer SCT3.

The third base resin BS3 may include a material having a relatively high light transmittance. The third base resin BS3 may be made of a transparent organic material.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light.

As the first and second wavelength conversion portions WLC1 and WLC2 and the light transmission portion LTU are disposed on the light emitting element layer EML through the second planarization layer OC2 and the first capping layer CAP1, the display device may not require a separate substrate for the first and second wavelength conversion portions WLC1 and WLC2 and the light transmission portion LTU.

The second capping layer CAP2 may cover the first and second wavelength conversion portions WLC1 and WLC2, the light transmission portion LTU, and the first light blocking member BK1.

The third planarization layer OC3 may be disposed on an upper side of the second capping layer CAP2 to planarize upper ends of the first and second wavelength conversion portions WLC1 and WLC2 and the light transmission portion LTU. The third planarization layer OC3 may include an organic material.

The second light blocking member BK2 may be disposed in the light blocking area BA on the third planarization layer OC3. The second light blocking member BK2 may overlap the first light blocking member BK1 or the second bank BNK2 in the thickness direction. The second light blocking member BK2 may block transmission of light.

The first color filter CF1 may be disposed in the first light emitting area LA1 on the third planarization layer OC3. The first color filter CF1 may be surrounded by the second light blocking member BK2. The first color filter CF1 may overlap the first wavelength conversion portion WLC1 in the thickness direction. The first color filter CF1 may selectively transmit the light of the first color (for example, the red light), and block or absorb the light of the second color (for example, the greed light) and the light of the third color (for example, the blue light).

The second color filter CF2 may be disposed in the second light emitting area LA2 on the third planarization layer OC3. The second color filter CF2 may be surrounded by the second light blocking member BK2. The second color filter CF2 may overlap the second wavelength conversion portion WLC2 in the thickness direction. The second color filter CF2 may selectively transmit the light of the second color (for example, the green light), and block or absorb the light of the first color (for example, the red light) and the light of the third color (for example, the blue light).

The third color filter CF3 may be disposed in the third light emitting area LA3 on the third planarization layer OC3. The third color filter CF3 may be surrounded by the second light blocking member BK2. The third color filter CF3 may overlap the light transmission portion LTU in the thickness direction. The third color filter CF3 may selectively transmit the light of the third color (for example, the blue light), and block or absorb the light of the first color (for example, the red light) and the light of the second color (for example, the green light).

The first to third color filters CF1, CF2, and CF3 may absorb a portion of light introduced from the outside of the display device to reduce reflected light due to external light. Therefore, the first to third color filters CF1, CF2, and CF3 may prevent color distortion due to reflection of the external light.

The third passivation layer PAS3 may cover the first to third color filters CF1, CF2, and CF3. The third passivation layer PAS3 may protect the first to third color filters CF1, CF2, and CF3.

The encapsulation member ENC may be disposed on the third passivation layer PAS3. For example, the encapsulation member ENC may include at least one inorganic film to prevent permeation of oxygen or moisture. The encapsulation member ENC may include at least one organic film to protect the display device from foreign matters such as dust.

Each of the first and second wavelength conversion portions WLC1 and WLC2 and the light transmission portion LTU may be deteriorated by heat generated from the light emitting elements ED of the light emitting element layer EML on a lower side thereof. For example, the light emitting elements ED may include a first light emitting element disposed in the first light emitting area LA1, a second light emitting element disposed in the second light emitting area LA2, and a third light emitting element disposed in the third light emitting area LA3. Each of the light emitting elements disposed in each of the light emitting areas LA1, LA2, and LA3 may be supplied with a current from the first electrode AE. Each of the light emitting elements disposed in each of the light emitting areas LA1, LA2, and LA3 may emit light through the current supplied from the first electrode AE. The current may include a first current supplied to the first light emitting area LA1, a second current supplied to the second light emitting area LA2, and a third current supplied to the third light emitting area LA3. The first to third currents may be different from each other. A detailed description thereof will be provided below.

Figure 3:
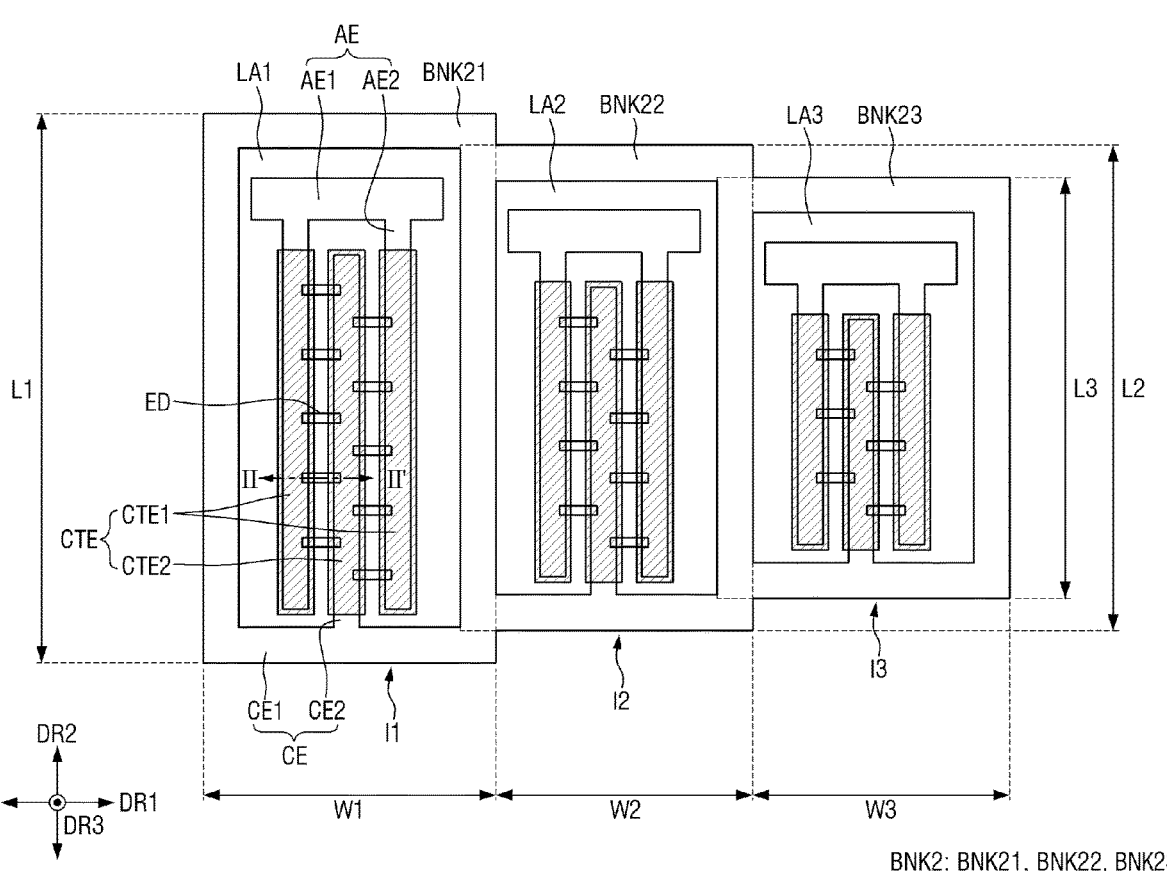
FIG. 3 is a schematic plan view illustrating one pixel of the display device according to an embodiment.
Figure 4:
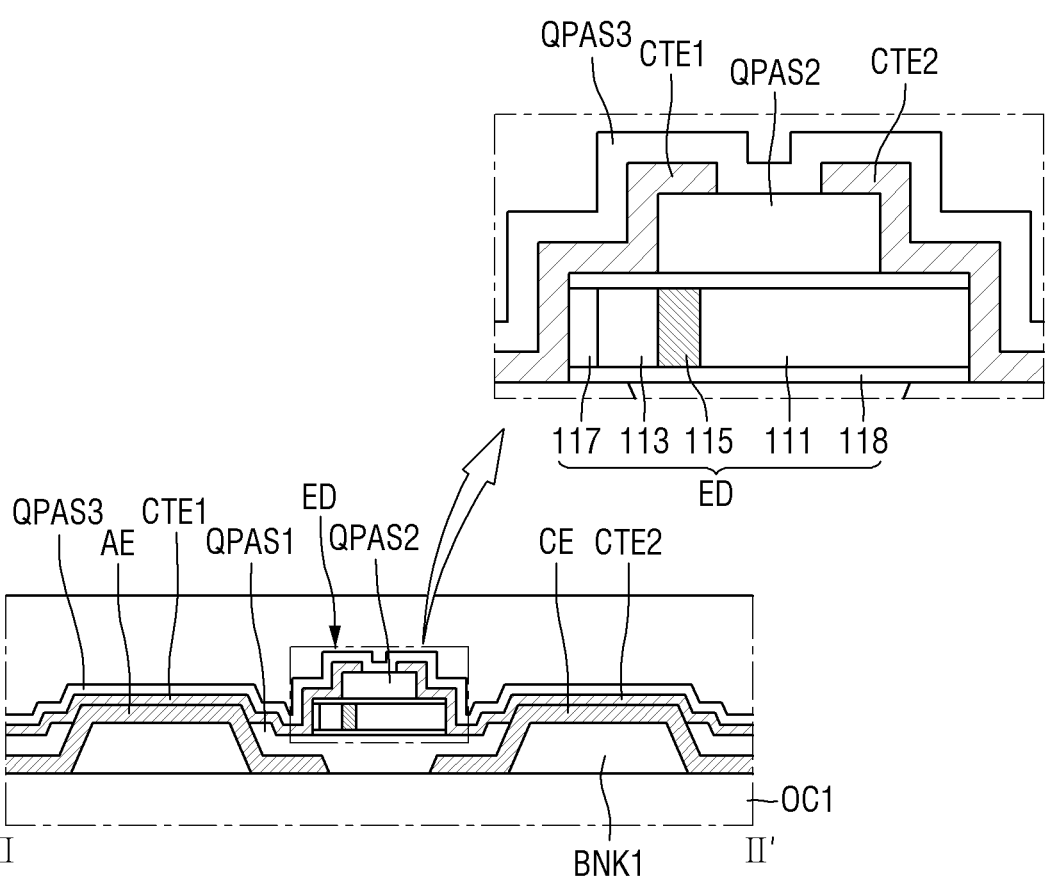
FIG. 4 is a schematic cross-sectional view taken along line II-II' of FIG. 3.

FIG. 3 is a schematic plan view illustrating one pixel of the display device according to an embodiment. FIG. 4 is a schematic cross-sectional view taken along line II-II of FIG. 3.

Referring to FIGS. 3 and 4 together with FIG. 2, each of the pixels may include first to third sub-pixels. Each of the first to third sub-pixels may correspond to each of the first to third light emitting areas LA1, LA2, and LA3. The light emitting element ED of each of the first to third sub-pixels may emit light through the first to third light emitting areas LA1, LA2, and LA3.

The light emitting elements ED of each of the first to third sub-pixels may emit light of the same color, and different lights may be emitted to the outside by the wavelength conversion portions WLC1 and WLC2 and the light transmission portion LTU disposed in each of the first to third sub-pixels. For example, red light may be emitted from the first sub-pixel, green light may be emitted from the second sub-pixel, and blue light may be emitted from the third sub-pixel.

As another example, the light emitting elements ED of each of the first to third sub-pixels may also emit light of different colors. Red light may be emitted from the first sub-pixel, green light may be emitted from the second sub-pixel, and blue light may be emitted from the third sub-pixel.

Each of the first to third sub-pixels may include first and second electrodes AE and CE, a light emitting element ED, a contact electrodes CTE, and a second banks BNK2.

The first and second electrodes AE and CE may be electrically connected to the light emitting element ED to be applied with a voltage, and the light emitting element ED may emit light in a specific wavelength band. At least a portion of the first and second electrodes AE and CE may form an electric field in the pixel, and the light emitting element ED may be aligned by the electric field.

For example, the first electrode AE may be a pixel electrode separated for each of the first to third sub-pixels, and the second electrode CE may be a common electrode commonly connected to the first to third sub-pixels. One of the first electrode AE and the second electrode CE may be an anode electrode of the light emitting element ED, and the other thereof may be a cathode electrode of the light emitting element ED.

The first electrode AE may include a first electrode stem portion AE1 extending in the first direction DR1 and at least one first electrode branch portion AE2 branching from the first electrode stem portion AE1 and extending in the second direction DR2.

The first electrode stem portion AE1 of each of the first to third sub-pixels may be spaced apart from the first electrode stem portion AE1 of the adjacent sub-pixel, and the first electrode stem portion AE1 may be disposed on an imaginary extension line with the first electrode stem portions AE1 of the sub-pixels adjacent to each other in the first direction DR1. The first electrode stem portions AE1 of the first to third sub-pixels may receive different signals and may be independently driven.

The first electrode branch portion AE2 may branch from the first electrode stem portion AE1 and extend in the second direction DR2. One end or an end of the first electrode branch portion AE2 may be connected to the first electrode stem portion AE1, and the other end of the first electrode branch portion AE2 may be spaced apart from the second electrode stem portion CE1 facing the first electrode stem portion AE1.

The second electrode CE may include a second electrode stem portion CE1 extending in the first direction DR1 and a second electrode branch portion CE2 branching from the second electrode stem portion CE1 and extending in the second direction DR2. The second electrode stem portion CE1 of each of the first to third sub-pixels may be connected to the second electrode stem portion CE1 of the adjacent sub-pixel. The second electrode stem portion CE1 may extend in the first direction DR1 to cross or intersect the pixels. The second electrode stem portion CE1 may be connected to an outer portion of the display area DA or a portion extending in one direction or a direction from the non-display area NDA.

The second electrode branch portion CE2 may be spaced apart from the first electrode branch portion AE2 to face each other. One end or an end of the second electrode branch portion CE2 may be connected to the second electrode stem portion CE1, and the other end of the second electrode branch portion CE2 may be spaced apart from the first electrode stem portion AE1.

The first electrode AE may be electrically connected to the thin film transistor layer TFTL of the display device through a first contact hole CNT1, and the second electrode CE may be electrically connected to the thin film transistor layer TFTL of the display device through a second contact hole CNT2. For example, the first contact hole CNT1 may be disposed in each of the first electrode stem portions AE1, and the second contact hole CNT2 may be disposed in the second electrode stem portion CE1, but is not limited thereto.

The second bank BNK2 may be disposed at a boundary between the pixels. The first electrode stem portions AE1 may be spaced apart from each other based on the second bank BNK2. The second bank BNK2 may extend in the second direction DR2, and may be disposed at a boundary between the pixels PX arranged or disposed in the first direction DR1. The second bank BNK2 may also be disposed at a boundary of the pixels PX arranged or disposed in the second direction DR2. The second bank BNK2 may define the boundary between the pixels.

The second bank BNK2 may prevent an ink from crossing or intersecting the boundary between the pixels PX in case that the ink in which the light emitting element ED is dispersed is sprayed at the time of manufacturing the display device. The second bank BNK2 may separate the different light emitting elements ED from each other so that inks in which the different light emitting elements ED are dispersed do not mix with each other.

The light emitting element ED may be disposed between the first electrode AE and the second electrode CE. One end or an end of the light emitting element ED may be connected to the first electrode AE, and the other end of the light emitting element ED may be connected to the second electrode CE.

The light emitting elements ED may be disposed to be spaced apart from each other, and may be aligned substantially parallel to each other. An interval between the light emitting elements ED spaced apart from each other is not particularly limited.

The light emitting elements ED may include active layers having the same material or a similar material to emit light of the same wavelength band or light of the same color. The first to third sub-pixels may emit light of the same color. For example, the light emitting elements ED may emit light of a third color or blue light having a peak wavelength in the range of about 440 nm to about 480 nm.

The contact electrode CTE may include first and second contact electrodes CTE1 and CTE2. The first contact electrode CTE1 may cover portions of the first electrode branch portion AE2 and the light emitting element ED, and may electrically connect the first electrode branch portion AE2 and the light emitting element ED to each other. The second contact electrode CTE2 may cover other portions of the second electrode branch portion CE2 and the light emitting element ED, and may electrically connect the second electrode branch portion CE2 and the light emitting element ED to each other.

The first contact electrode CTE1 may be disposed on the first electrode branch portion AE2 and extend in the second direction DR2. The first contact electrode CTE1 may be in contact with one end or an end of the light emitting element ED. The light emitting element ED may be electrically connected to the first electrode AE through the first contact electrode CTE1.

The second contact electrode CTE2 may be disposed on the second electrode branch portion CE2 and extend in the second direction DR2. The second contact electrode CTE2 may be spaced apart from the first contact electrode CTE1 in the first direction DR1. The second contact electrode CTE2 may be in contact with the other end of the light emitting element ED. The light emitting element ED may be electrically connected to the second electrode CE through the second contact electrode CTE2.

The light emitting element layer EML of the display device may be disposed on the thin film transistor layer TFTL, and may include first to third element insulating layers QPAS1, QPAS2, and QPAS3.

The first banks BNK1 may be disposed in the first to third light emitting areas LA1, LA2, and LA3, respectively. Each of the first banks BNK1 may correspond to the first electrode AE or the second electrode CE. Each of the first and second electrodes AE and CE may be disposed on the corresponding first bank BNK1. For example, the first banks BNK1 may be disposed on the first planarization layer OC1, and side surfaces of each of the first banks BNK1 may be inclined from the first planarization layer OC1. The inclined surface of the first bank BNK1 may reflect light emitted from the light emitting element ED.

The first electrode stem portion AE1 may include the first contact hole CNT1 penetrating through the first planarization layer OC1. The first electrode stem portion AE1 may be electrically connected to the thin film transistor TFT through the first contact hole CNT1.

The second electrode stem portion CE1 may extend in the first direction DR1 and may also be disposed in a non-light emitting area in which the light emitting element ED is not disposed. The second electrode stem portion CE1 may include the second contact hole CNT2 penetrating through the first planarization layer OC1. The second electrode stem portion CE1 may be electrically connected to a power electrode through the second contact hole CNT2. The second electrode CE may receive an electrical signal from the power electrode.

The first and second electrodes AE and CE may include a transparent conductive material. The first and second electrodes AE and CE may include a conductive material having a high reflectivity. The first and second electrodes AE and CE may have a structure in which one or more layers made of the transparent conductive material and one or more layers made of the metal having the high reflectivity are stacked or may be formed as one layer or a layer including the transparent conductive material and the metal having the high reflectivity.

The first element insulating layer QPAS1 may be disposed on the first planarization layer OC1, the first electrode AE, and the second electrode CE. The first element insulating layer QPAS1 may cover a portion of each of the first and second electrodes AE and CE.

The first element insulating layer QPAS1 may protect the first and second electrodes AE and CE, and insulate the first and second electrodes AE and CE from each other. The first element insulating layer QPAS1 may prevent the light emitting element ED from being in direct contact with and being damaged by other members.

The light emitting element ED may be disposed between the first electrode AE and the second electrode CE on the upper side of the first element insulating layer QPAS1. One end or an end of the light emitting element ED may be connected to the first electrode AE, and the other end of the light emitting element ED may be connected to the second electrode CE.

The second element insulating layer QPAS2 may be partially disposed on the light emitting element ED disposed between the first and second electrodes AE and CE. The second element insulating layer QPAS2 may be disposed on a central portion of a top surface of the light emitting element ED. The third element insulating layer QPAS3 may partially surround an outer surface of the light emitting element ED. The third element insulating layer QPAS3 may protect the light emitting element ED. The third element insulating layer QPAS3 may surround the outer surface of the light emitting element ED.

The contact electrode CTE may include first and second contact electrodes CTE1 and CTE2. The first contact electrode CTE1 may cover portions of the first electrode branch portion AE2 and the light emitting element ED, and may electrically connect the first electrode branch portion AE2 and the light emitting element ED to each other. The second contact electrode CTE2 may cover other portions of the second electrode branch portion CE2 and the light emitting element ED, and may electrically connect the second electrode branch portion CE2 and the light emitting element ED to each other.

The first contact electrode CTE1 may be disposed on the first electrode branch portion AE2 and extend in the second direction DR2. The first contact electrode CTE1 may be in contact with one end or an end of the light emitting element ED. The light emitting element ED may be electrically connected to the first electrode AE through the first contact electrode CTE1.

The first contact electrode CTE1 may be in direct contact with a top surface of one end side or an end side of the second element insulating layer QPAS2.

The second contact electrode CTE2 may be disposed on the second electrode branch portion CE2 and extend in the second direction DR2. The second contact electrode CTE2 may be spaced apart from the first contact electrode CTE1 in the first direction DR1. The second contact electrode CTE2 may be in contact with the other end of the light emitting element ED. The light emitting element ED may be electrically connected to the second electrode CE through the second contact electrode CTE2.

The second contact electrode CTE2 may be in direct contact with a top surface of the other end side of the second element insulating layer QPAS2.

The first contact electrode CTE1 and the second contact electrode CTE2 may be disposed on a same layer. The first contact electrode CTE1 and the second contact electrode CTE2 may each expose a top surface of the central portion of the second element insulating layer QPAS2.

Each of the first contact electrode CTE1 and the second contact electrode CTE2 may include a conductive material. The first contact electrode CTE1 may include a first material, and the second contact electrode CTE2 may include a second material. However, the first material and the second material may have different physical properties. A detailed description thereof will be provided below.

Figure 5:
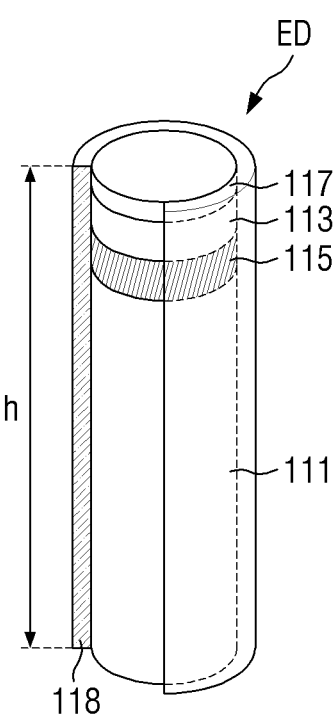
FIG. 5 is a view illustrating a light emitting element according to an embodiment.

FIG. 5 is a view illustrating a light emitting element according to an embodiment. Referring to FIG. 5, the light emitting element ED may be a light emitting diode. The light emitting element ED may have a size of a micro-meter or a nano-meter unit, and may be an inorganic light emitting diode including an inorganic material. The inorganic light emitting diode may be aligned between the two electrodes according to an electric field formed between the two electrodes facing each other in a specific direction.

The light emitting element ED may have a shape extending in one direction or a direction. The light emitting element ED may have a shape such as a rod, a wire, or a tube. The light emitting element ED may include a first semiconductor layer 111, a second semiconductor layer 113, an active layer 115, an electrode layer 117, and an insulating film 118. A length h of the light emitting element ED may be about 4 μm.

The first semiconductor layer 111 may be an n-type semiconductor. The first semiconductor layer 111 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be any one or more of AlGaInN, GaN, AlGaN, InGaN, AlN, and InN doped with an n-type. The first semiconductor layer 111 may be doped with an n-type dopant, which may be Si, Ge, Sn, or the like within the spirit and the scope of the disclosure. For example, the first semiconductor layer 111 may be made of n-GaN doped with n-type Si. A thickness of the first semiconductor layer 111 may be in the range of about 500 nm to about 1 μm, but is not limited thereto.

The second semiconductor layer 113 may be a p-type semiconductor, and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be any one or more of AlGaInN, GaN, AlGaN, InGaN, AlN, and InN doped with a p-type. The second semiconductor layer 113 may be doped with a p-type dopant, which may be Mg, Zn, Ca, Ba, or the like within the spirit and the scope of the disclosure. For example, the second semiconductor layer 113 may be made of p-GaN doped with p-type Mg. A thickness of the second semiconductor layer 113 may be in the range of about 30 nm to about 200 nm.

The active layer 115 may be disposed between the first semiconductor layer 111 and the second semiconductor layer 113. The active layer 115 may emit light by a recombination of electrons and holes according to light emitting signals applied through the first semiconductor layer 111 and the second semiconductor layer 113. The active layer 115 may include a material having a single or multiple quantum well structure. In case that the active layer 115 may include the material having the multiple quantum well structure, the active layer 115 may also have a structure in which a well layers and barrier layers may be alternately stacked each other. For example, the active layer 115 may have a structure in which semiconductor materials having large band gap energy and semiconductor materials having small band gap energy may be alternately stacked each other, and may include other Group III to Group V semiconductor materials depending on a wavelength band of emitted light.

Although not illustrated, a superlattice layer may be further disposed between the active layer 115 and the first semiconductor layer 111. The superlattice layer may alleviate stress due to a difference in lattice constant between the first semiconductor layer 111 and the active layer 115. For example, the superlattice layer may be formed of InGaN or GaN. A thickness of the superlattice layer may be in a range of about 50 to about 200 nm.

Referring back to FIGS. 2 and 3, the second bank BNK2 may define each of the light emitting areas LA1, LA2, and LA3. The second bank BNK2 may include a second-first bank BNK21 defining the first light emitting area LA1, a second-second bank BNK22 defining the second light emitting area LA2, and a second-third bank BNK23 defining the third light emitting area LA3. As illustrated in FIG. 3, a size of the second-first bank BNK21 in a plan view, a size of the second-second bank BNK22 in a plan view, and a size of the second-third bank BNK23 in a plan view may be different from each other. Each of the banks BNK21, BNK22, and BNK23 has widths W1, W2, and W3 extending along the first direction DR1 and lengths L1, L2, and L3 extending along the second direction DR2. Each of the banks BNK21, BNK22, and BNK23 may have a same width W1, W2, and W3 extending along the first direction DR1. However, each of the banks BNK21, BNK22, and BNK23 may have different lengths L1, L2, and L3 extending along the second direction DR2.

In an embodiment, a first current I1 supplied to the first light emitting area LA1 may be greater than a second current I2 supplied to the second light emitting area LA2 and a third current I3 supplied to the third light emitting area LA3, and the second current I2 supplied to the second light emitting area LA2 may be greater than the third current I3 supplied to the third light emitting area LA3.

A current density of each of the light emitting areas LA1, LA2, and LA3 may mean a value obtained by dividing an intensity of each of the currents I1, I2, and I3 by the size of each of the corresponding light emitting areas LA1, LA2, and LA3 in a plan view. In an embodiment, since the first current I1 supplied to the first light emitting area LA1 is greater than the second current I2 supplied to the second light emitting area LA2 and the third current I3 supplied to the third light emitting area LA3, and the second current I2 supplied to the second light emitting area LA2 is greater than the third current I3 supplied to the third light emitting area LA3, the current density of each of the light emitting areas LA1, LA2, and LA3 may be adjusted to a uniform level by designing the size of the first light emitting area LA1 in a plan view to be greater than the size of the second light emitting area LA2 in a plan view and the size of the third light emitting area LA3 in a plan view, and designing the size of the second light emitting area LA2 in a plan view to be greater than the size of the third light emitting area LA3 in a plan view.

In case that the current density of each of the light emitting areas LA1, LA2, and LA3 is high, heat generated by the light emitting elements ED positioned in each of the light emitting areas LA1, LA2, and LA3 increases. For this reason, the first and second wavelength conversion portions WLC1 and WLC2 and the light transmission portion LTU are each likely to be deteriorated by the heat generated from the light emitting elements ED of the light emitting element layer EML on the lower side thereof. However, according to an embodiment, as the current density of each of the light emitting areas LA1, LA2, and LA3 is adjusted to the uniform level by designing the size of the first light emitting area LA1 in a plan view to be greater than the size of the second light emitting area LA2 in a plan view and the size of the third light emitting area LA3 in a plan view, and designing the size of the second light emitting area LA2 in a plan view to be greater than the size of the third light emitting area LA3 in a plan view, there is an advantage in that deterioration of the first and second wavelength conversion portions WLC1 and WLC2 and the light transmission portion LTU on an upper portion may be minimized.

Figure 6:
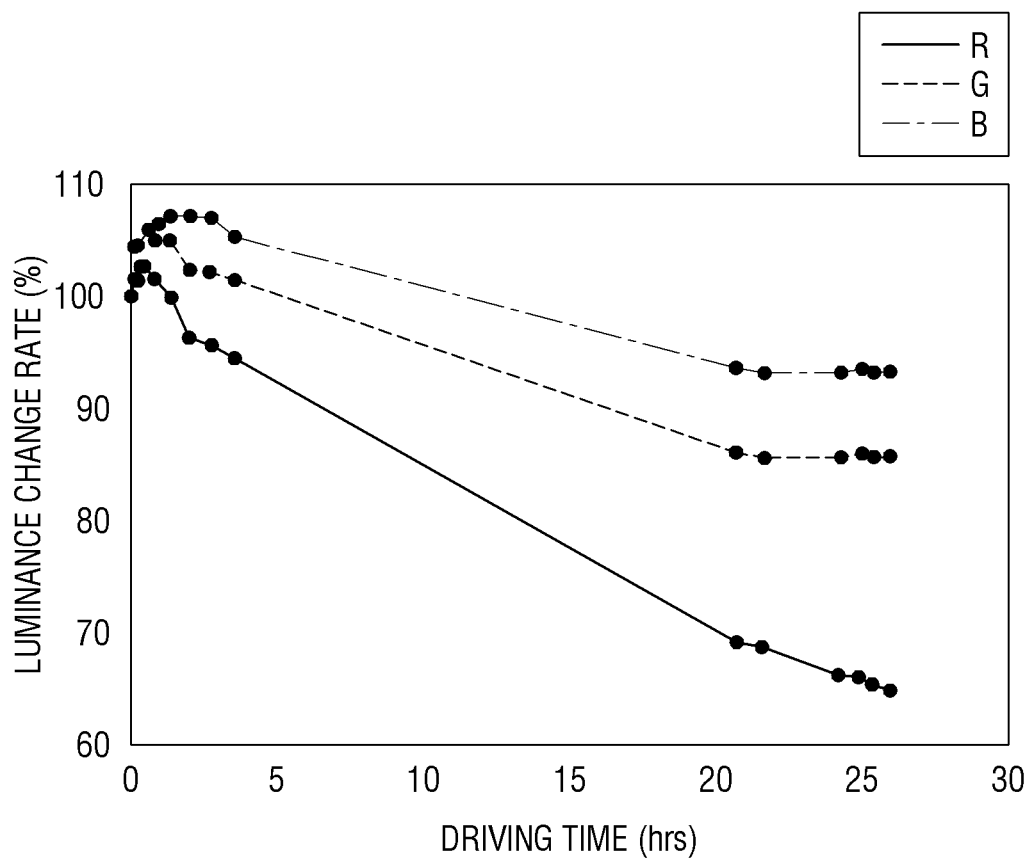
FIG. 6 is a graph illustrating a luminance change rate according to a driving time for each sub-pixel.

Furthermore, even if the current density of each of the light emitting areas LA1, LA2, and LA3 is adjusted to the uniform level, in case that the currents I1, I2, and I3 applied to each of the light emitting areas LA1, LA2, and LA3 are large, physical damage to the light emitting elements ED may occur due to deterioration of the light emitting elements ED positioned in each of the light emitting areas LA1, LA2, and LA3, and some deteriorated light emitting elements ED may not operate. As illustrated in FIG. 6, it may be seen that the most degradation occurs in the first light emitting area LA1 (R in FIG. 6) to which the largest current I1 is applied, the second most degradation occurs in the second light emitting area LA2 (G in FIG. 6) to which the current I2 having the next magnitude is applied, and the smallest deterioration occurs in the third light emitting area LA3 (B in FIG. 6) to which the smallest current I3 is applied.

However, according to an embodiment, by designing the size of the second-first bank BNK21 in a plan view, the size of the second-second bank BNK22 in a plan view, and the size of the second-third bank BNK23 in a plan view to be different from each other, the number of light emitting elements ED disposed in the light emitting areas LA1, LA2, LA3 defined by each of the second banks BNK21, BNK22, and BNK23 may be adjusted. For example, the size of the second-first bank BNK21 in a plan view may be larger than the size of the second-second bank BNK22 in a plan view and the size of the second-third bank BNK23 in a plan view, respectively, and the size of the second-second bank BNK22 in a plan view may be larger than the size of the second-third bank BNK23 in a plan view. Accordingly, the number of light emitting elements ED disposed in the first light emitting area LA1 may be greater than the number of light emitting elements ED disposed in the second light emitting area LA2 and the number of light emitting elements ED disposed in the third light emitting area LA3, and the number of light emitting elements ED disposed in the second light emitting area LA2 may be greater than the number of light emitting elements ED disposed in the third light emitting area LA3.

As described above, in case that the currents I1, I2, and I3 applied to each of the light emitting areas LA1, LA2, and LA3 are large, the physical damage to the light emitting elements ED may occur due to deterioration of the light emitting elements ED positioned in each of the light emitting areas LA1, LA2, and LA3, and some deteriorated light emitting elements ED may not operate. For example, in the order of the magnitude of the currents I1, I2, and I3, a possibility of damage to the light emitting elements ED disposed in the first light emitting area LA1 due to deterioration may be greater than a possibility of damage to the light emitting elements ED disposed in the second light emitting area LA2 due to deterioration and a possibility of damage to the light emitting elements ED disposed in the third light emitting area LA3 due to deterioration, and the possibility of damage to the light emitting elements ED disposed in the second light emitting area LA2 due to deterioration may be greater than the possibility of damage to the light emitting elements ED disposed in the third light emitting area LA3 due to deterioration. However, as described above, by adjusting the sizes of the second banks BNK1, BNK2, and BNK3 to design the number of light emitting elements ED disposed in the first light emitting area LA1 to be greater than the number of light emitting elements ED disposed in the second light emitting area LA2 and the number of light emitting elements ED disposed in the third light emitting area LA3, and to design the number of light emitting elements ED disposed in the second light emitting area LA2 to be greater than the number of light emitting elements ED disposed in the third light emitting area LA3, the number of light emitting elements ED disposed in each of the light emitting areas LA1, LA2, and LA3 and not damaged by deterioration may be maintained at a same level.

Hereinafter, a display device according to an embodiment will be described.

In the following embodiments, the same components as those of the previously described embodiments are denoted by the same reference numerals, and descriptions thereof will be omitted or simplified.

Figure 7:
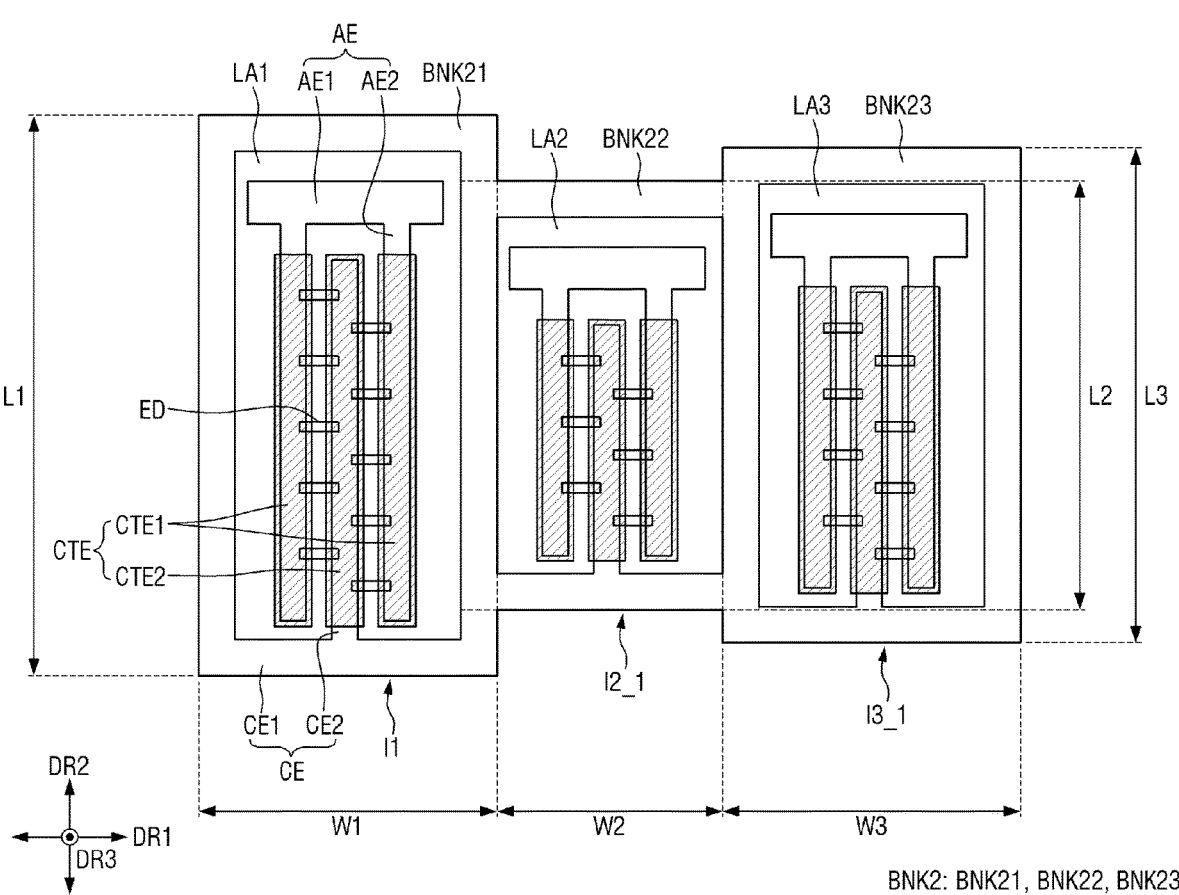
FIG. 7 is a schematic plan view illustrating one pixel of a display device according to an embodiment.

FIG. 7 is a plan view illustrating one pixel of a display device according to an embodiment.

Referring to FIG. 7, a display device according to the embodiment is different from the display device described with reference to FIG. 3 in that the magnitude of a second current I2_1 applied to the second light emitting area LA2 is smaller than the first and third currents I1 and I3, respectively, the size of the second-second bank BNK22 is smaller than the sizes of the second-third bank BNK23 and the second-first bank BNK21, respectively, and the number of light emitting elements ED disposed in the second light emitting area LA2 is smaller than the number of light emitting elements ED disposed in the first and third light emitting areas LA1 and LA3, respectively.

Since other descriptions have been made with reference to FIGS. 1 to 6, detailed descriptions thereof will be omitted.

Figure 8:
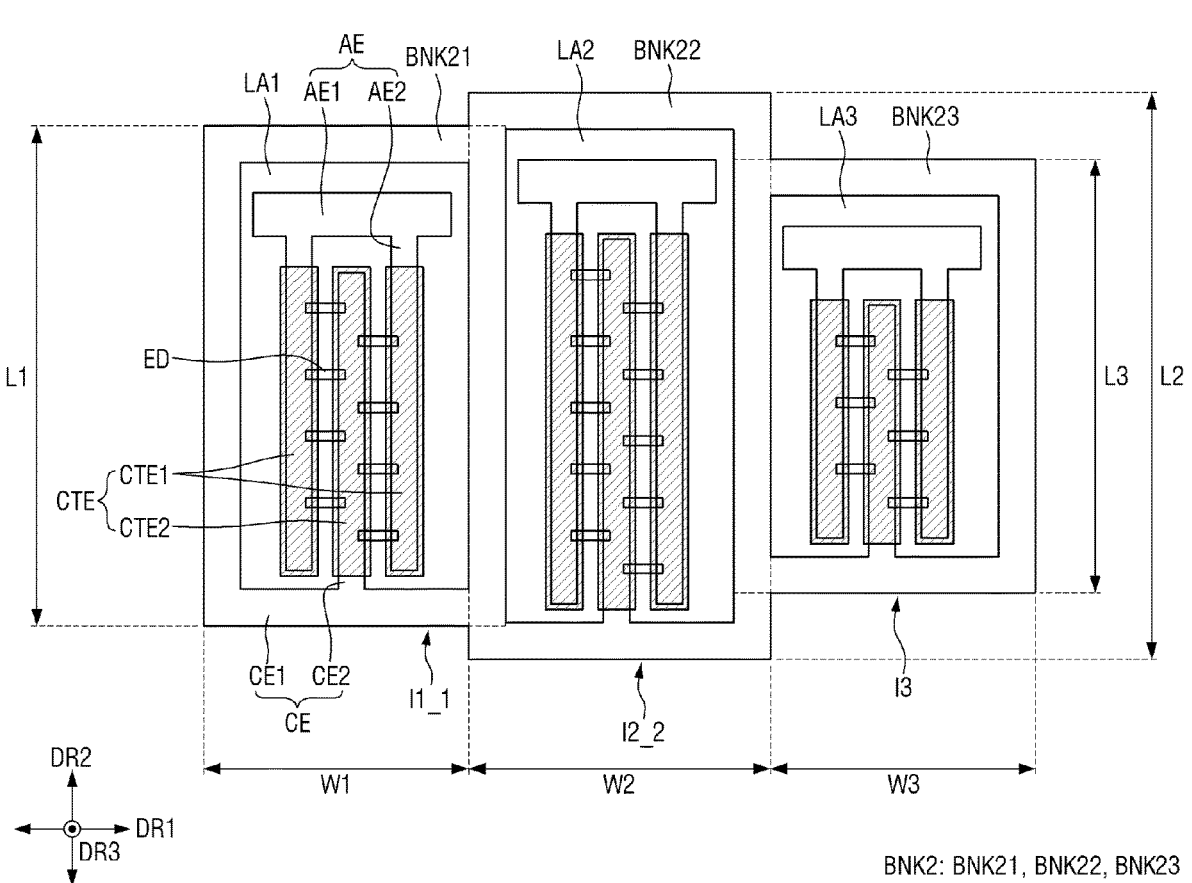
FIG. 8 is a schematic plan view illustrating one pixel of a display device according to an embodiment.

FIG. 8 is a plan view illustrating one pixel of a display device according to an embodiment.

Referring to FIG. 8 a display device according to the embodiment is different from the display device described with reference to FIG. 3 in that the magnitude of a first current I1_1 is smaller than that of the second current I2_2, the size of the second-first bank BNK21 is smaller than the size of the second-second bank BNK22, and the number of light emitting elements ED disposed in the first light emitting area LA1 is smaller than the number of light emitting elements ED disposed in the second light emitting area LA2.

Since other descriptions have been made with reference to FIGS. 1 to 6, detailed descriptions thereof will be omitted.

Figure 9:
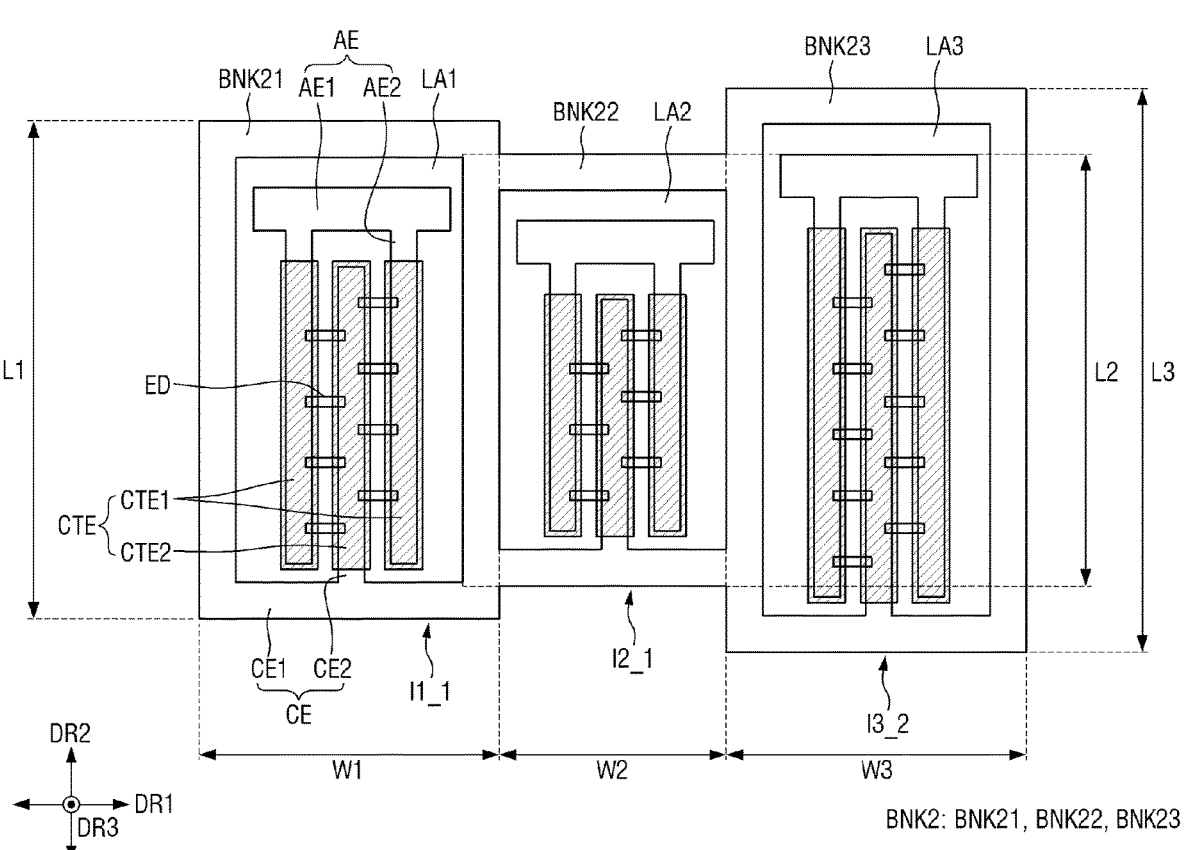
FIG. 9 is a schematic plan view illustrating one pixel of a display device according to an embodiment.

FIG. 9 is a plan view illustrating one pixel of a display device according to an embodiment.

Referring to FIG. 9, a display device according to the embodiment is different from the display device described with reference to FIG. 3 in that the magnitude of the second current I2_1 applied to the second light emitting area LA2 is smaller than the first and third currents I1_1 and I3_2, respectively, the magnitude of the first current I1_1 is smaller than the third current I3_2, the size of the second-second bank BNK22 is smaller than those of the second-first and second-third banks BNK21 and BNK23, respectively, the size of the second-first bank BNK21 is smaller than the size of the second-third bank BNK23, the number of light emitting elements ED disposed in the second light emitting area LA2 is smaller than the number of light emitting elements ED disposed in the first and third light emitting areas LA1 and LA3, respectively, and the number of light emitting elements ED disposed in the first light emitting area LA1 is smaller than the number of light emitting elements ED disposed in the third light emitting area LA3.

Since other descriptions have been made with reference to FIGS. 1 to 6, detailed descriptions thereof will be omitted.

Figure 10:
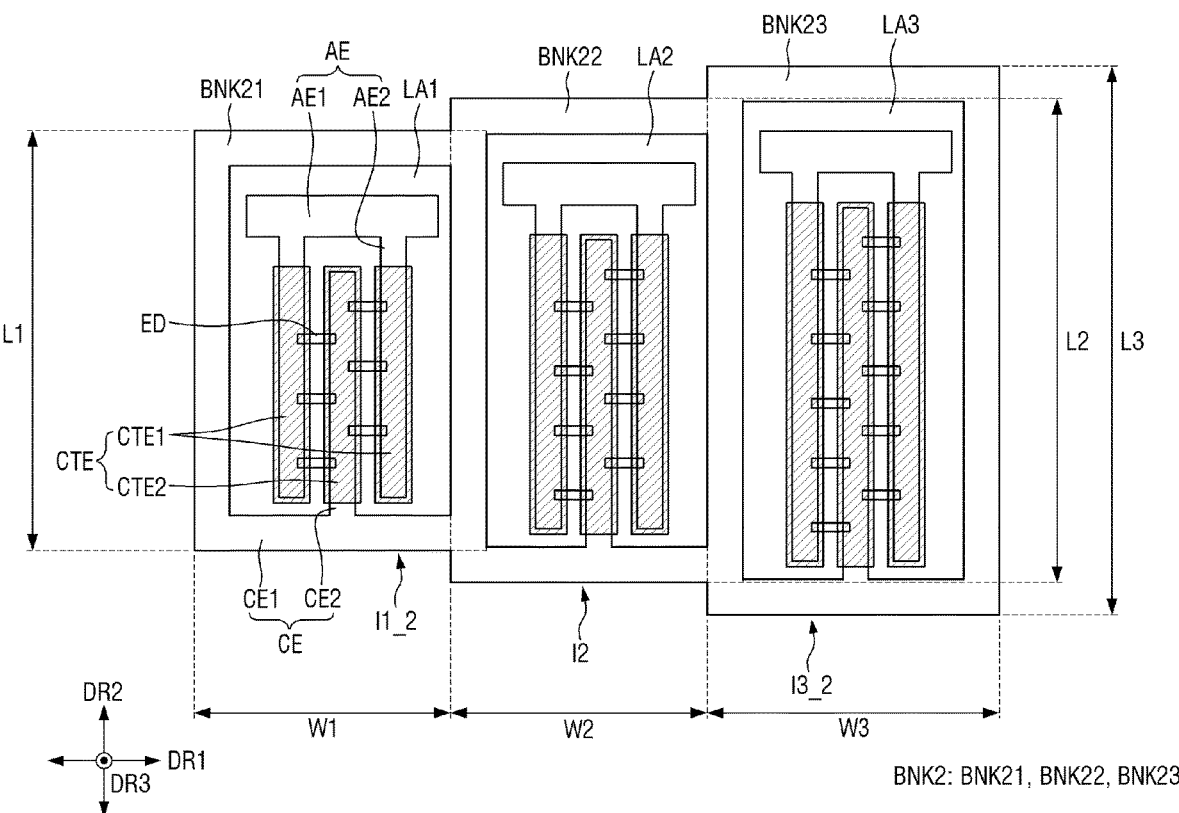
FIG. 10 is a schematic plan view illustrating one pixel of a display device according to an embodiment.

FIG. 10 is a plan view illustrating one pixel of a display device according to an embodiment.

Referring to FIG. 10, a display device according to the embodiment is different from the display device described with reference to FIG. 3 in that the magnitude of the first current I1_2 applied to the first light emitting area LA1 is smaller than the second and third currents I2 and I3_2, respectively, the magnitude of the second current I2 is smaller than the third current I3_2, the size of the second-first bank BNK21 is smaller than those of the second-second and second-third banks BNK22 and BNK23, respectively, the size of the second-second bank BNK22 is smaller than the size of the second-third bank BNK23, the number of light emitting elements ED disposed in the first light emitting area LA1 is smaller than the number of light emitting elements ED disposed in the second and third light emitting areas LA2 and LA3, respectively, and the number of light emitting elements ED disposed in the second light emitting area LA2 is smaller than the number of light emitting elements ED disposed in the third light emitting area LA3.

Since other descriptions have been made with reference to FIGS. 1 to 6, detailed descriptions thereof will be omitted.

Figure 11:
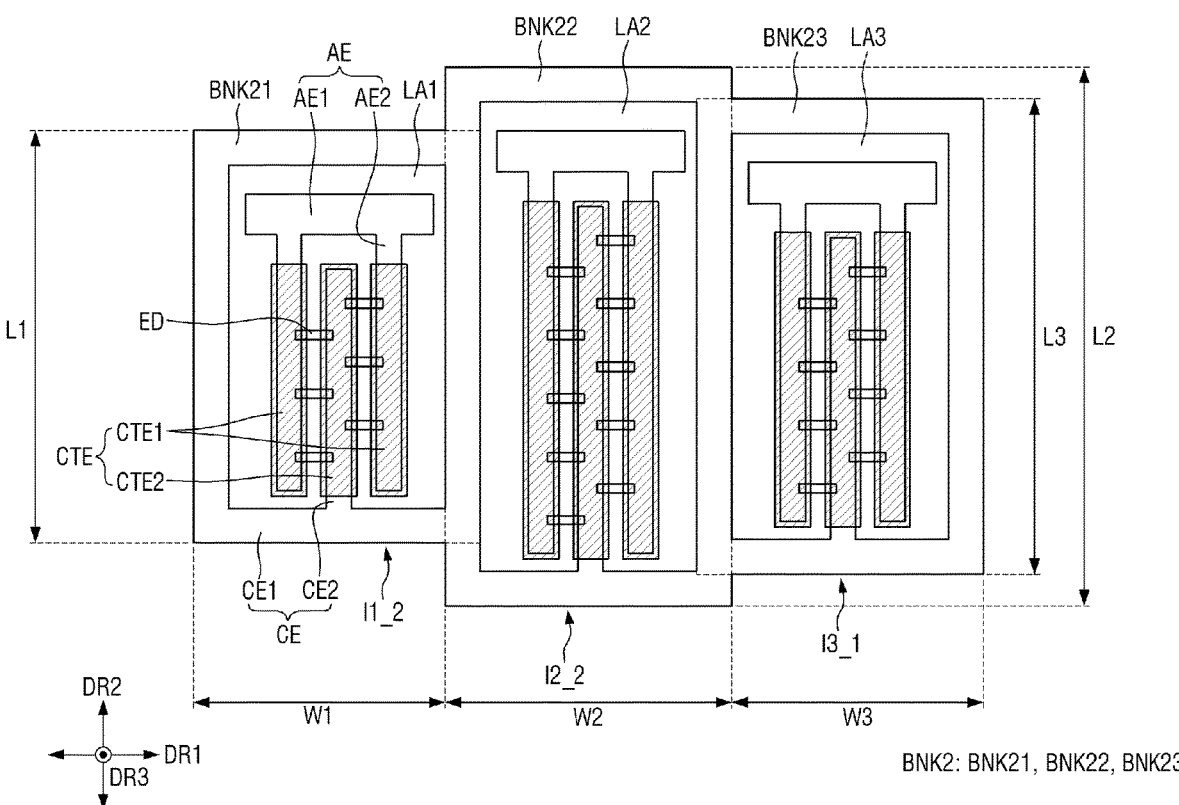
FIG. 11 is a schematic plan view illustrating one pixel of a display device according to an embodiment.

FIG. 11 is a plan view illustrating one pixel of a display device according to an embodiment.

Referring to FIG. 11, a display device according to the embodiment is different from the display device described with reference to FIG. 3 in that the magnitude of the first current I1_2 applied to the first light emitting area LA1 is smaller than the second and third currents I2_2 and I3_1, respectively, the magnitude of the third current I3_1 is smaller than the second current I2_2, the size of the second-first bank BNK21 is smaller than those of the second-second and second-third banks BNK22 and BNK23, respectively, the size of the second-third bank BNK23 is smaller than the size of the second-second bank BNK22, the number of light emitting elements ED disposed in the first light emitting area LA1 is smaller than the number of light emitting elements ED disposed in the second and third light emitting areas LA2 and LA3, respectively, and the number of light emitting elements ED disposed in the third light emitting area LA3 is smaller than the number of light emitting elements ED disposed in the second light emitting area LA2.

Since other descriptions have been made with reference to FIGS. 1 to 6, detailed descriptions thereof will be omitted.

In concluding the detailed description, those skilled in the art will appreciate that many variations and modifications can be made to the disclosed embodiments without substantially departing from the principles of the disclosure. Therefore, the disclosed embodiments are used in a generic and descriptive sense only and not for purposes of limitation.

What is claimed is:

1. A display device comprising:
a substrate including a first light emitting area, a second light emitting area, and a third light emitting area;
first banks spaced apart from each other on the substrate;
first electrodes and second electrodes disposed on the first bank, covering the first bank, and spaced apart from each other;
light emitting elements respectively disposed on the first electrodes and the second electrodes; and
second banks respectively disposed on the first electrodes and the second electrodes, wherein
the second banks include a second-first bank defining the first light emitting area, a second-second bank defining the second light emitting area, and a second-third bank defining the third light emitting area,
a size of the second-first bank, a size of the second-second bank, and a size of the second-third bank are different from each other in a plan view, and
a length of the second-first bank, a length of the second-second bank, and a length of the second-third bank are different from each other.

2. The display device of claim 1, wherein a width of the second-first bank, a width of the second-second bank, and a width of the second-third bank are identical.

3. The display device of claim 2, wherein the light emitting elements include:
a first light emitting element disposed in the first light emitting area,
a second light emitting element disposed in the second light emitting area, and
a third light emitting element disposed in the third light emitting area.

4. The display device of claim 3, wherein the first light emitting element, the second light emitting element, and the third light emitting element emit light of a same color.

5. The display device of claim 4, wherein the light of the color emitted by the first light emitting element, the second light emitting element, and the third light emitting element is blue.

6. The display device of claim 5, wherein
a first electrode of the first electrodes overlapping the first light emitting elements in a plan view is applied with a first current, a first electrode of the first electrodes overlapping the second light emitting elements in the plan view is applied with a second current, and
a first electrode of the first electrodes overlapping the third light emitting elements in the plan view is applied with a third current.

7. The display device of claim 6, wherein each of a magnitude of the first current and a magnitude of the second current is greater than a magnitude of the third current.

8. The display device of claim 7, wherein each of the length of the second-first bank and the length of the second-second bank is greater than the length of the second-third bank.

9. The display device of claim 8, wherein each of a number of the first light emitting elements in the first light emitting area and a number of the second light emitting elements in the second light emitting area is greater than a number of the third light emitting elements in the third light emitting area.

10. The display device of claim 9, wherein the magnitude of the first current is greater than the magnitude of the second current.

11. The display device of claim 10, wherein the length of the second-first bank is greater than the length of the second-second bank.

12. The display device of claim 1, further comprising:
a first contact electrode electrically connected to the first electrodes and electrically contacting an end of each of the light emitting elements, and
a second contact electrode electrically connected to the second electrodes and electrically contacting another end of each of the light emitting elements.

13. The display device of claim 12, further comprising:
a first element insulating layer disposed between the first electrodes and the second electrodes, and the light emitting elements; and
a second element insulating layer disposed on a top surface of the light emitting elements.

14. The display device of claim 13, wherein
the first contact electrode directly contacts a top surface on a side of the second element insulating layer,
the second contact electrode directly contacts a top surface on another side of the second element insulating layer, and
the first contact electrode and the second contact electrode each expose a top surface of a central portion of the second element insulating layer.

15. The display device of claim 14, further comprising:
a third element insulating layer covering and contacting the first contact electrode and the second contact electrode.

16. A display device comprising:
a substrate including a first light emitting area, a second light emitting area, a third light emitting area, and a light blocking area disposed between adjacent first light emitting area, second light emitting area, and third light emitting area;
first banks spaced apart from each other on the substrate;
first electrodes and second electrodes disposed on the first bank, covering the first bank, and spaced apart from each other;
light emitting elements respectively disposed on the first electrodes and the second electrodes; and
second banks respectively disposed on the first electrodes and the second electrodes, in the light blocking area, wherein the second banks include a second-first bank defining the first light emitting area, a second-second bank defining the second light emitting area, and a second-third bank defining the third light emitting area, a size of the second-first bank, a size of the second-second bank, and a size of the second-third bank are different from each other in a plan view, and a length of the second-first bank, a length of the second-second bank, and a length of the second-third bank are different from each other.

17. The display device of claim 16, wherein the light emitting elements include a first light emitting element disposed in the first light emitting area, a second light emitting element disposed in the second light emitting area, and a third light emitting element disposed in the third light emitting area, and a number of the first light emitting elements in the first light emitting area, a number of the second light emitting elements in the second light emitting area, and the number of the third light emitting elements in the third light emitting area are different from each other.

18. The display device of claim 17, further comprising:

a first wavelength conversion portion disposed on the first light emitting element on the first light emitting area, a second wavelength conversion portion disposed on the second light emitting element on the second light emitting area, and a light transmission portion disposed on the third light emitting element on the third light emitting area.

19. The display device of claim 18, further comprising:

a light blocking member disposed between the first wavelength conversion portion, the second wavelength conversion portion, and the light transmission portion adjacent to each other on the light blocking area.

* * * * *